（12）United States Patent
Nishimura

(10) Patent No.: US 11,887,941 B2
(45) Date of Patent: Jan. 30, 2024

(54) SEMICONDUCTOR MODULE WITH REINFORCED SEALING RESIN

(71) Applicant: FUJI ELECTRIC CO., LTD., Kanagawa (JP)

(72) Inventor: Tomohiro Nishimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 62 days.

(21) Appl. No.: 17/409,822

(22) Filed: Aug. 24, 2021

(65) Prior Publication Data

US 2022/0108959 A1 Apr. 7, 2022

(30) Foreign Application Priority Data

Oct. 1, 2020 (JP) ................................. 2020-167332

(51) Int. Cl.
*H01L 23/00* (2006.01)
*H01L 23/08* (2006.01)
*H01L 23/29* (2006.01)

(52) U.S. Cl.
CPC ............ *H01L 23/562* (2013.01); *H01L 23/08* (2013.01); *H01L 23/295* (2013.01)

(58) Field of Classification Search
CPC . H01L 23/28–3195; H01L 23/293–295; H01L 23/08; H01L 23/562
See application file for complete search history.

(56) References Cited

U.S. PATENT DOCUMENTS

| 2011/0074037 A1* | 3/2011 | Takeshima .............. H01L 24/83 257/773 |
| 2013/0240909 A1* | 9/2013 | Hiramatsu ............ H01L 23/293 257/77 |
| 2021/0366796 A1* | 11/2021 | Higashi ................. H01L 23/049 |

FOREIGN PATENT DOCUMENTS

| JP | H0634256 U | 5/1994 |
| JP | 2014150204 A | 8/2014 |

* cited by examiner

*Primary Examiner* — Laura M Menz
*Assistant Examiner* — Candice Chan

(57) ABSTRACT

Provided is a semiconductor module, including: a semiconductor chip; a circuit board on which the semiconductor chip is mounted; a sealing resin including epoxy resin for sealing the semiconductor chip and the circuit board; and a reinforcing material, with a higher Young's modulus than the sealing resin, provided in close contact with the sealing resin above at least a part of the sealing resin. The semiconductor module includes a resin case for enclosing spaces for housing the semiconductor chip, wherein the sealing resin may be provided inside the resin case.

18 Claims, 12 Drawing Sheets

SEMICONDUCTOR MODULE WITH REINFORCED SEALING RESIN

The contents of the following Japanese patent application are incorporated herein by reference:
NO. 2020-167332 filed in JP on Oct. 1, 2020.

BACKGROUND

1. Technical Field

The present invention relates to a semiconductor module.

2. Related Art

Conventionally, a semiconductor module is known in which a semiconductor chip is mounted on a circuit board and the semiconductor chip is connected to the circuit pattern of the circuit board by a wiring portion such as a lead frame. In such a semiconductor module, a sealing resin is used to protect semiconductor chips and other components. (For example, refer to Patent Document 1)
Patent Document 1: Japanese Utility Model Application Publication No. H6-34256

SUMMARY

In a semiconductor module, it is preferable to suppress fracture in the sealing resin.

To solve the above-mentioned problem, one aspect of the present invention provides a semiconductor module. The semiconductor module may include a semiconductor chip. The semiconductor module may include a circuit board. The circuit board may have a semiconductor chip mounted thereon. The semiconductor module may include a sealing resin. The sealing resin may seal the semiconductor chip and the circuit board. The sealing resin may include epoxy resin. The semiconductor module may include a reinforcing material. The reinforcing material may be provided in close contact with the sealing resin above at least a part of the sealing resin. The reinforcing material may have a higher Young's modulus than the sealing resin.

The summary clause does not necessarily describe all necessary features of the embodiments of the present invention. The present invention may also be a sub-combination of the features described above.

DESCRIPTION OF EXEMPLARY EMBODIMENTS

Hereinafter, the invention will be described through embodiments of the invention, but the following embodiments do not limit the invention according to claims. In addition, not all of the combinations of features described in the embodiments are essential to the solving means of the invention. It is noted that in the present specification and the drawings, elements having substantially the same functions and configurations are marked with the same sign to omit redundant explanations, and elements not directly related to the present invention are omitted from the drawings. In addition, in a single drawing, elements with the same function and configuration may be marked with a representative sign, and signs of others may be omitted.

In the present specification, one side in a direction parallel to the depth direction of a semiconductor chip is referred to as an "upper" side, and the other side is referred to as a "lower" side. One surface of two principal surfaces of a substrate, a layer or other member is referred to as an upper surface, and the other surface is referred to as a lower surface. The "upper" and "lower" directions are not limited to the gravity direction or the direction in which the semiconductor module is implemented In the present specification, technical matters may be described using orthogonal coordinate axes of an X axis, a Y axis, and a Z axis. The orthogonal coordinate axes are only to specify relative positions of components, and shall not limit them to specific directions. For example, the Z axis is not limited to indicate the height direction with respect to the ground. Note that a +Z axis direction and a −Z axis direction are directions opposite to each other. In a case where the Z axis direction is described without a description of positive and negative signs, the direction means a direction parallel to the +Z axis and the −Z axis. In the present specification, the orthogonal axes parallel to the upper surface and the lower surface of the semiconductor chip are referred to as the X axis and the Y axis. Further, an axis perpendicular to the upper surface and the lower surface of the semiconductor substrate is referred to as the Z axis. In the present specification, the Z axis direction may be referred to as the depth direction. In addition, in the present specification, a direction parallel to the upper surface and the lower surface of the semiconductor substrate may be referred to as a horizontal direction, including the X axis direction and the Y axis direction.

In the present specification, an expression such as "same" or "equal" may include the case which has an error due to a variation in manufacturing or the like. The error is, for example, within 10%.

Figure 1:
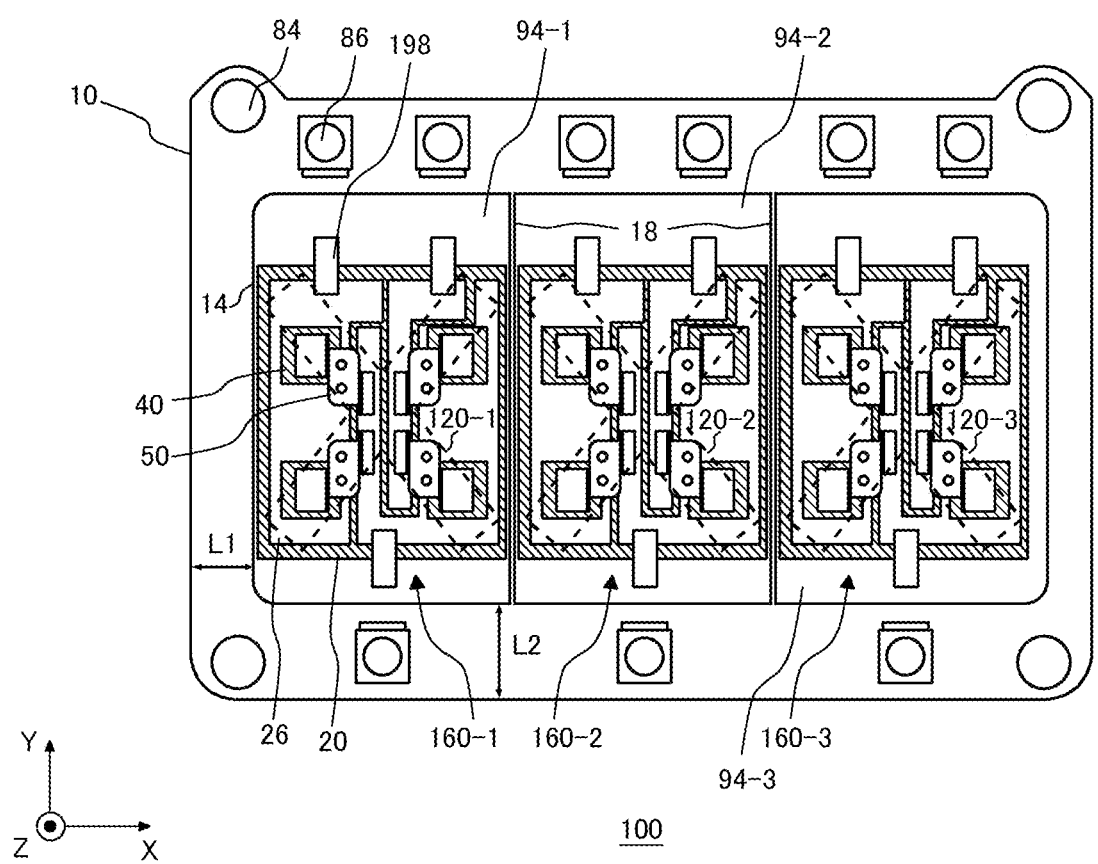
FIG. 1 illustrates one example of a semiconductor module 100 according to one embodiment of the present invention.

FIG. 1 illustrates one example of the semiconductor module 100 according to one embodiment of the present invention. In FIG. 1, for ease of understanding, the reinforcing material 120 is shown as a dotted line and a sealing resin 12 is omitted.

The semiconductor module 100 may function as a power conversion device of an inverter or the like. The semiconductor module 100 includes one or more circuit boards 160.

In the present specification, the orthogonal axes in the plane where the one or more circuit boards 160 are provided are the X axis and the Y axis, and the axis perpendicular to the XY plane is the Z axis. In FIG. 1, an arrangement example of each member in the XY plane is shown.

The semiconductor module 100 of this example includes the three circuit boards 160, each of which configures a U-phase, V-phase, and W-phase arm. In the example of FIG. 1, the semiconductor module 100 includes a circuit board 160-1, a circuit board 160-2 and a circuit board 160-3. One or more semiconductor chips 40 are mounted on the circuit board 160. The semiconductor chip 40 is protected by a resin package such as a resin case 10 that encloses the circuit board 160 or the sealing resin 12 (refer to FIG. 3) that fills the resin case 10.

The semiconductor chip 40 may include an insulated gate bipolar transistor (IGBT), a diode such as a free wheel diode (FWD), a reverse conducting (RC)-IGBT combining these, a MOS transistor and so on.

The resin case 10 is provided to enclose a space 94 that houses the semiconductor chip 40 and the circuit board 160. The resin case 10 has a side wall 18. The side walls 18 divide the space that houses the semiconductor chip 40 and the circuit board 160. In FIG. 1, the side walls 18 divide the space into a space 94-1, a space 94-2 and a space 94-3. The circuit board 160 is provided in each of the space 94-1, the space 94-2 and the space 94-3.

One or more terminals 86 may be provided protruding from the resin case 10. The terminal 86 may be connected electrically to the circuit board 160 via a terminal connection portion 198. In addition, in the resin case 10, a through hole 84 with a fastening member, such as a screw for fixing a cooling portion 16 (refer to FIG. 3) or the like, inserted therein may be provided.

In this example, the resin case 10 is molded from a resin such as thermosetting resin, which can be formed by injection molding, or a UV-curing resin, which can be formed by UV molding. The resin may include one or more polymeric materials selected from, for example, polyphenylene sulfide (PPS) resin, polybutylene terephthalate (PBT) resin, polyamide (PA) resin, acrylonitrile butadiene styrene (ABS) resin, acrylic resin and so on.

In this example, the sealing resin 12 is provided inside the resin case 10. The sealing resin 12 includes epoxy resin. In addition, the sealing resin 12 includes curing agent. The sealing resin 12 seals the semiconductor chip 40 and the circuit board 160. The semiconductor chip 40 and the circuit board 160 can be protected by the sealing resin 12. In this example, the sealing resin 12 is divided into a sealing resin 12-1, a sealing resin 12-2 and a sealing resin 12-3 by the side walls 18.

In this example, the sealing resin 12 includes silica filler, which is inorganic filler. The silica filler is an inorganic particulate that enhances the functionality of the resin. The silica filler includes $SiO_2$. The sealing resin 12 may include silica filler at 40 wt % or more. The sealing resin 12 may include silica filler at 50 wt % or more. The sealing resin 12 may include silica filler at 60 wt % or more. The sealing resin 12 may include silica filler at 70 wt % or more. The sealing resin 12 may include silica filler at 80 wt % or more. The sealing resin 12 may include silica filler at 90 wt % or less. In this example, the sealing resin 12 includes silica filler at approximately 70 wt %. By including silica filler in the sealing resin 12, the thermally-resistant property of the sealing resin 12 can be improved. For example, by including silica filler in the sealing resin 12, the thermally-resistant property at a temperature of 175° C. or higher can be ensured. It is noted that the sealing resin 12 may also additionally include an additive such as a curing accelerator, a mold release agent, a coloring agent, or a flame retardant.

If the sealing resin 12 includes a large amount of silica filler, the sealing resin 12 tends to fracture. That is, when the semiconductor module 100 deforms as a whole due to heat or other factors, the sealing resin 12 tends to crack. If the sealing resin 12 is fractured, the protection of the semiconductor chip 40 is weakened, which can lead to breakdown voltage failure and reduced reliability.

In this example, the semiconductor module 100 includes the plate-shaped reinforcing material 120. The reinforcing material 120 is provided in close contact with the sealing resin 12 above at least a part the sealing resin 12. Being in close contact means that, for example, the reinforcing material 120 does not separate from the sealing resin 12 when the up and down directions are reversed. In addition, being in close contact may also mean that the relative positions of the sealing resin 12 and the reinforcing material 120 do not change even when a vibration is applied from the outside. In the example of FIG. 1, the reinforcing materials 120 (a reinforcing material 120-1, a reinforcing material 120-2 and a reinforcing material 120-3) are provided in close contact with the sealing resin 12-1, the sealing resin 12-2 and the sealing resin 12-3, respectively. It is noted that in this embodiment, being in close contact refers to material bonding or chemical bonding, and may not include mechanical bonding such as screw fixing, press fitting, shrinkage fitting, or swaging.

The reinforcing material 120 has a higher Young's modulus than the sealing resin 12. Young's modulus is a proportional constant of strain and stress, calculated from Hooke's law. That is, Young's modulus is a measure of the hardness of a material. The reinforcing material 120, which is provided in close contact with the sealing resin 12 and has a higher Young's modulus than the sealing resin 12, can suppress the deformation of the sealing resin 12 even when the semiconductor module 100 is deformed as a whole. Accordingly, the fracture of the sealing resin 12 can be suppressed.

The area of the reinforcing material 120 in a top view may be smaller than the area of the sealing resin 12 in a top view. In this example, the area of the reinforcing material 120-1 in a top view may be smaller than the area of the sealing resin 12-1 in a top view. In addition, the area of the reinforcing material 120-2 in a top view may be smaller than the area of the sealing resin 12-2 in a top view. In addition, the area of the reinforcing material 120-3 in a top view may be smaller than the area of the sealing resin 12-3 in a top view. By reducing the area of the reinforcing material 120 in a top view to be smaller than the area of the sealing resin 12 in a top view, a place, above which the reinforcing material 120 is not provided, can be provided on the sealing resin 12. At a hardening step of the sealing resin 12, which is described later, gas is generated from the sealing resin 12. By providing a place, above which no reinforcing material 120 is provided, on a sealing resin 12, gas can be removed from the sealing resin 12. The area of the reinforcing material 120 may be half or less than the area of the sealing resin 12.

The reinforcing material 120 may include glass. By including glass in the reinforcing material 120, the Young's modulus of the reinforcing material 120 can be made higher than the Young's modulus of the sealing resin 12.

The reinforcing material 120 may be provided in the vicinity of an interface 14 between the resin case 10 and the sealing resin 12 in a top view. Among the interfaces 14 between the resin case 10 and the sealing resin 12 in a top view, the reinforcing material 120 may be provided in the vicinity of each interface 14 in the X axis direction and the Y axis direction. Providing the reinforcing material 120 in the vicinity of the interface 14 between the resin case 10 and the sealing resin 12 may mean that the shortest distance between the reinforcing material 120 and the interface 14, which is between the resin case 10 and the sealing resin 12, is within 5 mm. Providing the reinforcing material 120 in the vicinity of the interface 14 between the resin case 10 and the sealing resin 12 may also mean that the shortest distance between the reinforcing material 120 and the interface 14, which is between the resin case 10 and the sealing resin 12, is within 3 mm. Providing the reinforcing material 120 in the vicinity of the interface 14 between the resin case 10 and the sealing resin 12 may also mean that the shortest distance between the reinforcing material 120 and the interface 14, which is between the resin case 10 and the sealing resin 12, is within 1 mm. In addition, providing the reinforcing material 120 in the vicinity of the interface 14 between the resin case 10 and the sealing resin 12 may also mean that the shortest distance between the reinforcing material 120 and the interface 14, which is between the resin case 10 and the sealing resin 12, may be shorter than either the lateral width L1 of the edge or the longitudinal width L2 of the edge in a top view of the resin case 10. The shortest distance between the reinforcing material 120 and the interface 14, which is between the resin case 10 and the sealing resin 12, may also be shorter than each of the lateral width L1 and the longitudinal width L2. By providing the reinforcing material 120 in the vicinity of the interface 14, which is between the resin case 10 and the sealing resin 12, the deformation of the sealing resin 12 can be further suppressed.

Figure 2:
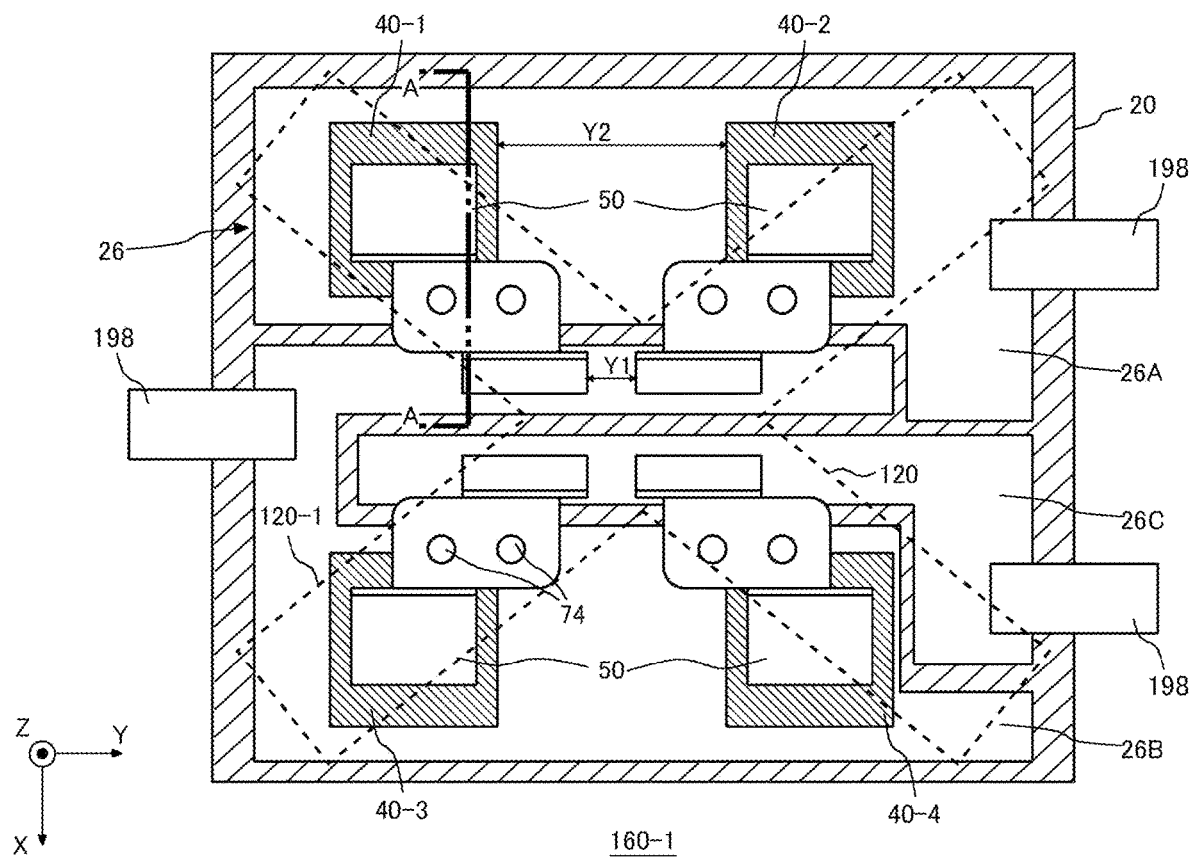
FIG. 2 illustrates one example of a circuit board 160-1.

FIG. 2 illustrates one example of the circuit board 160-1. In FIG. 2, also for ease of understanding, the reinforcing material 120 is shown as a dotted line and the sealing resin 12 is omitted. Herein, the circuit board 160-1 that configures the arm of one phase is shown as a representative example, but the circuit boards 160 of other phases have the same configuration. The circuit board 160-1 of this example has a circuit pattern 26 provided on a plane of either side of the insulating substrate 20 and a heat releasing board 22 (refer to FIG. 3) provided on a plane of the other side. The circuit pattern 26 and the heat releasing board 22 may be configured by bonding a copper or aluminum plate, or a plate plated with these materials, directly to an insulating substrate 20 such as silicon nitride ceramics or aluminum nitride ceramics or the like, or by bounding through a brazing layer. It is noted that the circuit board 160 may also be made by laminating an insulating sheet to a conductive member such as a copper or aluminum plate. That is, the circuit board may be a plate-shaped member that integrates conductive and insulating members.

The semiconductor chip 40 of this example is bonded, via a bonding layer 30 (refer to FIG. 3) such as solder, to the circuit pattern 26 provided on the upper surface of the insulating substrate 20. In addition, the semiconductor chip 40 has its upper surface connected, via the bonding layer 32 (refer to FIG. 3) such as solder, to a wiring portion. The wiring portion of this example is a lead frame 50. The lead frame 50 connects the semiconductor chip 40, via the bonding layer 34 (refer to FIG. 3) such as solder, to the circuit pattern 26. The lead frame 50 is a member formed of a metal material such as copper or aluminum. The lead frame 50 may also have at least a part of its surface plated by nickel or the like. In addition, the lead frame 50 may also have at least a part of its surface coated by resin or the like. The lead frame 50 may have a plate-shaped portion. Plate-shaped refers to a shape in which the area of the two principal surfaces arranged to be opposing is larger than the area of the other surface. The lead frame 50 may at least have the portion connected to the semiconductor chip 40 to be plate-shaped. The lead frame 50 may be formed by bending a single metal plate.

The circuit pattern 26 transmits a signal or power by connecting electrically with the semiconductor chip 40 or the lead frame 50. The circuit pattern 26 may be configured to include a plurality of island regions 26A, 26B and 26C. In addition, a plurality of semiconductor chips 40 may be arranged in one island region of the circuit pattern 26. In the example of FIG. 2, a plurality of semiconductor chips 40 are arranged on each of the island region 26A and 26B. In addition, the plurality of semiconductor chips 40 arranged on one island region may be connected to the identical island region by the lead frame 50. In the example of FIG. 2, the plurality of semiconductor chips 40 arranged on the island region 26A are connected in parallel to the identical island region 26B, by two lead frames 50 arrayed in the Y axis direction. In addition, the plurality of semiconductor chips 40 arranged on the island region 26B are connected in parallel to the identical island region 26C by two lead frames 50 arrayed in the Y axis direction. The distance Y1 in the Y axis direction between the connecting portion of the two lead frames 50, which are connected in the identical island region 26B or 26C, may be shorter than the distance Y2 in the Y axis direction between the two semiconductor chips 40. In this way, the difference in the path length of the current flowing through the two semiconductor chips 40 arranged separately can be decreased.

The semiconductor chip 40 of this example is a vertical chip where electrodes (for example, an emitter electrode and a collector electrode) are formed on the upper surface and the lower surface. The semiconductor chip 40 is connected, by the electrode formed on the lower surface, to the circuit pattern 26 via the bonding layer 30, and is connected, by the electrode formed on the upper surface, to the lead frame 50 via the bonding layer 32. It is noted that the semiconductor chip 40 is not limited to a vertical chip. The semiconductor chip 40 may also have an electrode connected to the circuit pattern 26 provided on the upper surface. In this case, the electrode of the circuit pattern 26 may be connected by a wire or the like.

The terminal connection portion 198 connects the circuit pattern 26 directly or indirectly to the terminal 86 as shown in FIG. 1. The terminal connection portion 198 may be a plate or a rod-shaped member formed of metal, or may be a wire-shaped member. In this way, the semiconductor chip 40 is connected electrically to the terminal 86.

The reinforcing material 120 may be provided above at least a part of the semiconductor chip 40 in a top view. In this example, a reinforcing material 120-1 is respectively provided above at least a part of the four semiconductor chips 40 in a top view. In the vicinity of the semiconductor chip 40, thermal stress and other factors are generated, and deformation tends to occur. Accordingly, by providing the reinforcing material 120 above at least a part of the semiconductor chip 40 in a top view, the fracture of the sealing resin 12 in the vicinity of the semiconductor chip 40 can be suppressed.

In the example of FIG. 2, the reinforcing material 120 is provided in order to connect the two semiconductor chips 40. That is, the reinforcing material 120 is arranged to overlap with the two semiconductor chips 40 in a top view. The reinforcing material 120 may overlap with a part of each semiconductor chip 40, or may overlap with the whole. In addition, the reinforcing material 120 may be provided in a linear-shape in a top view from above one semiconductor chip 40 to above the other semiconductor chip 40. In another example, the reinforcing material 120 may be provided in a curve-shape in the top view. In FIG. 2, the reinforcing material 120 is provided to connect the semiconductor chip 40-1 and the semiconductor chip 40-4. In addition, in FIG. 2, the reinforcing material 120 is provided to connect the semiconductor chip 40-2 and the semiconductor chip 40-3. Such a configuration allows the reinforcing material 120 to be provided above the semiconductor chip 40 while reducing the area of the reinforcing material 120. It is noted that an example of connecting two semiconductor chips 40 is not limited to the above-mentioned one. A reinforcing material 120 may be provided to connect two semiconductor chips 40, which have a large difference in temperature due to heat generation.

Figure 3:
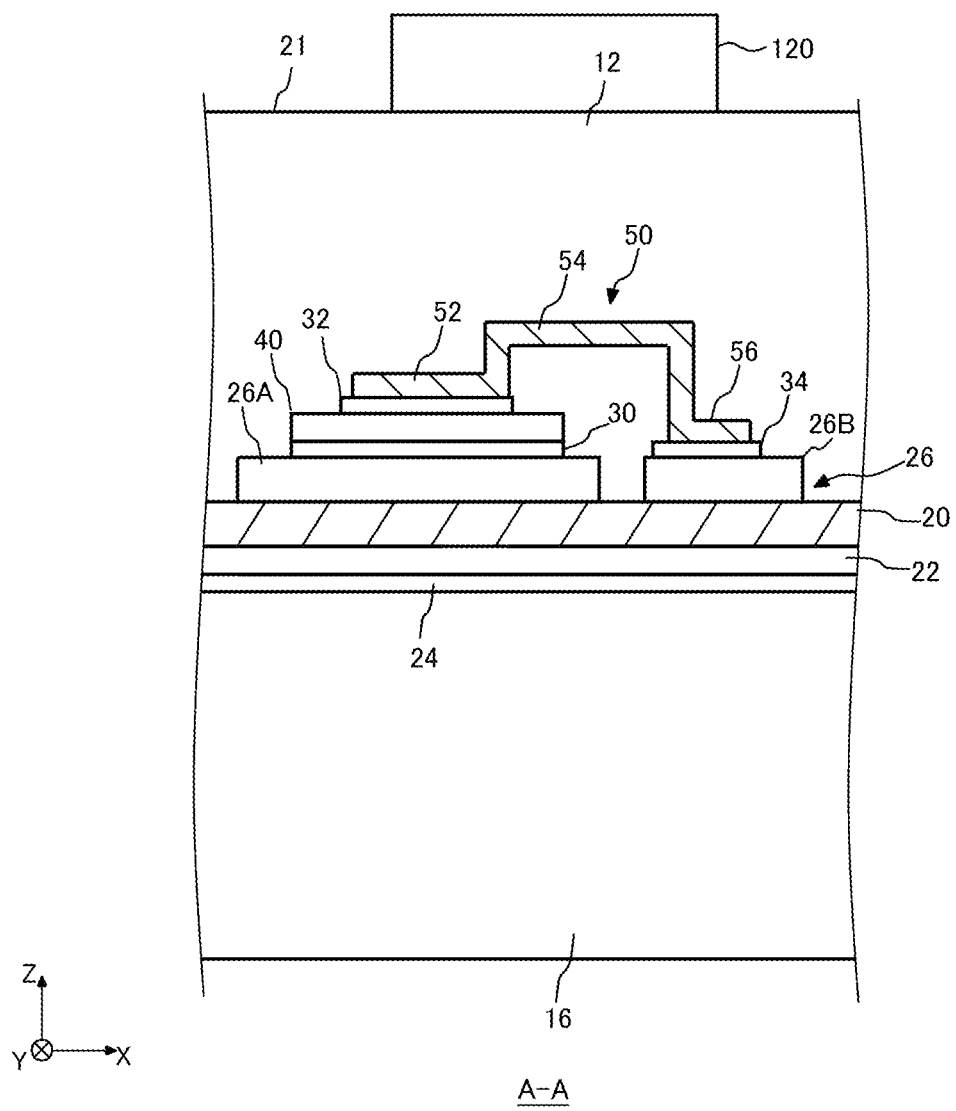
FIG. 3 illustrates one example of a cross-sectional view A-A in FIG. 2.

FIG. 3 illustrates one example of the cross-sectional view A-A in FIG. 2. It is noted that the reinforcing material 120 and the sealing resin 12 are illustrated by solid lines, different from FIG. 1 and FIG. 2. FIG. 3 shows an arrangement example of each member when projected against the XZ plane. In the cross section, the semiconductor module 100 includes an insulating substrate 20, a heat releasing board 22, a bonding layer 24, a cooling portion 16, a circuit pattern 26, a bonding layer 30, 32, 34, a semiconductor chip 40, a lead frame 50, a sealing resin 12 and a reinforcing material 120.

The heat releasing board 22 may cover at least a part or the entire of the lower surface of the insulating substrate 20. The bonding layer 24 bonds the heat releasing board 22 to the cooling portion 16. The bonding layer 24 is solder or the like. The cooling portion 16 includes a refrigerant such as water inside. The cooling portion 16 is connected directly or indirectly to the lower surface of the resin case 10 via the heat releasing board 22 or the like to cool down the semiconductor chip 40.

The circuit pattern 26 is arranged on the upper surface of the insulating substrate 20. The circuit pattern 26 may be formed of the same material such as copper as the heat releasing board 22 of this example, or may be formed of a different material. The semiconductor chip 40 of this example is connected to the upper surface of the island regions 26A, 26B of the circuit pattern 26 by the bonding layer 30. The bonding layer 30 bonds the semiconductor chips 40 by a conductive material such as solder.

The lead frame 50 of this example is connected to the semiconductor chip 40 and the island regions 26B, 26C of the circuit pattern 26. The lead frame 50 of this example includes a chip connection portion 52, a circuit pattern connection portion 56 and a bridging portion 54. The chip connection portion 52 is a portion bonded with the upper surface of the semiconductor chip 40 by the bonding layer 32. The circuit pattern connection portion 56 is a portion connected to the upper surface of the island regions 26B, 26C of the circuit pattern 26 by the bonding layer 34. The chip connection portion 52 and the circuit pattern connection portion 56 may be plate-shaped portions approximately parallel with the XY plane. It is noted that being approximately parallel refers to a state where, for example, an angle is 10 degrees or less. In this example, the area of the chip connection portion 52 is configured to be larger than the area of the circuit pattern connection portion 56. The area of the chip connection portion 52, and the area of the circuit pattern connection portion 56 may be, for example, the area of the upper surface of the plate-shaped portions connected to the semiconductor chip 40, or the island regions 26B, 26C of the circuit pattern 26.

The bridging portion 54 is connected to the chip connection portion 52 and the circuit pattern connection portion 56. The bridging portion 54 is arranged away from the conductive members such as the circuit pattern 26. The bridging portion 54 of this example is arranged above the circuit pattern 26 or the like, and is provided to span the circuit pattern 26 or the like from the chip connection portion 52 to the circuit pattern connection portion 56.

In the bridging portion 54, an opening portion 74 (refer to FIG. 2) is provided for implanting the sealing resin 12 below the bridging portion 54. In the bridging portion 54 of this example, a plurality of opening portions 74 are provided on the inner side of the bridging portion 54 in the XY plane, and around the center of the bridging portion 54 in the X axis direction. The plurality of opening portions 74 may be provided in a region that is not around the center of the bridging portion 54 in the X axis direction. It is noted that the opening portion 74 may be provided in not only the bridging portion 54, but also in the lead frame 50 or other portions, such as the chip connection portion 52 or the circuit pattern connection portion 56. This can ensure that the sealing resin 12 is spread over the top and the bottom of the lead frame 50.

The sealing resin 12 is provided inside the resin case 10. The sealing resin 12 may be filled in the space 94 of the resin case 10 to prevent the semiconductor chip 40, the lead frame 50 and the circuit pattern 26 from being exposed.

The reinforcing material 120 is provided in close contact with the sealing resin 12 above the sealing resin 12. In this example, the reinforcing material 120 is provided on the upper surface 21 of the sealing resin 12. By providing the reinforcing material 120 on the upper surface 21 of the sealing resin 12, the fracture of the sealing resin 12 can be suppressed.

Figure 4:
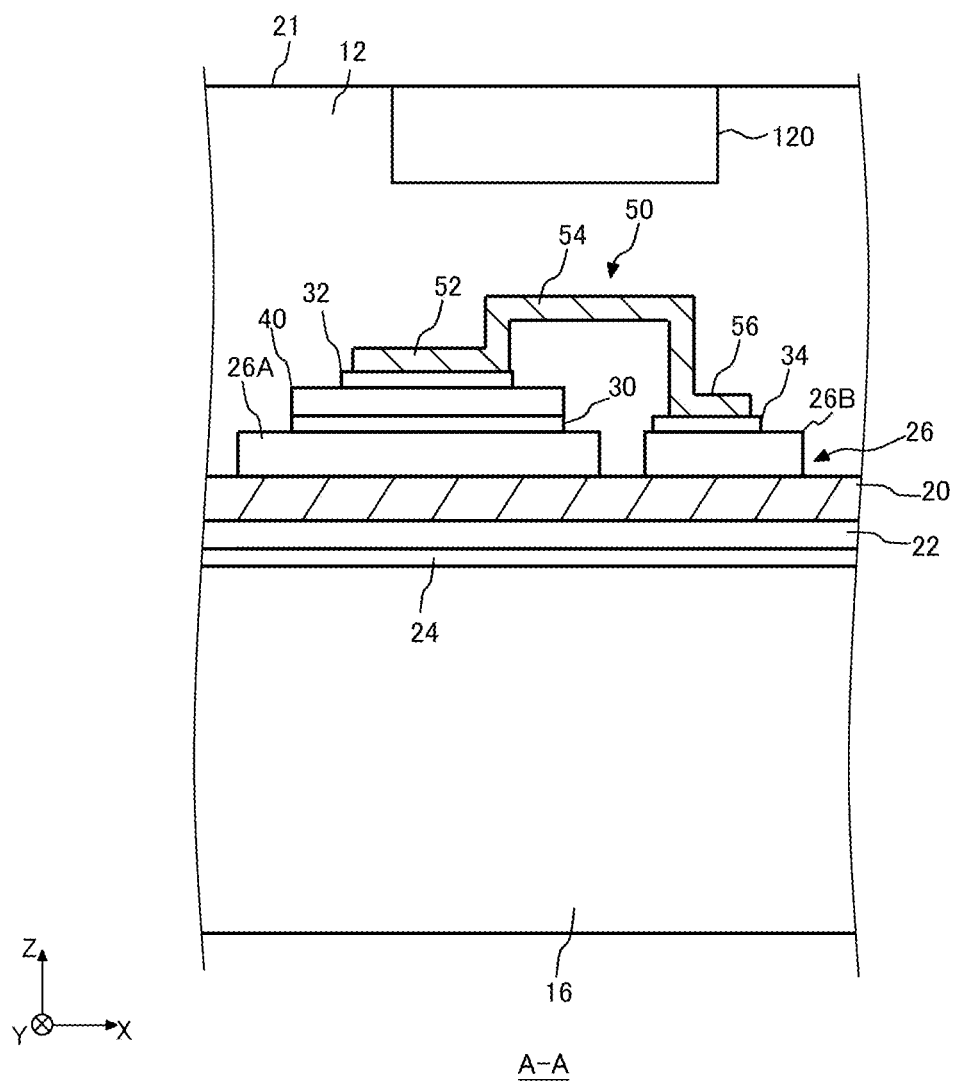
FIG. 4 illustrates another example of the cross-sectional view A-A in FIG. 2.

FIG. 4 illustrates another example of the cross-sectional view A-A in FIG. 2. The semiconductor module 100 in FIG. 4 is different from the semiconductor module 100 in FIG. 3 in the point that the reinforcing material 120 is embedded in the sealing resin 12. The configurations other than that in the FIG. 4 may be the same as those in FIG. 3.

When the reinforcing material 120 is provided on the upper surface 21 of the sealing resin 12 as shown in FIG. 3, a level difference is generated. By embedding the reinforcing material 120 in the sealing resin 12, the level difference can be eliminated. Accordingly, the semiconductor module 100 can be easily assembled when it is incorporated into a device or the like The reinforcing material 120 may have a part exposed from the sealing resin 12, or may be entirely enclosed by the sealing resin 12. In addition, the sealing resin 12 may also be provided above the reinforcing material 120.

Figure 5:
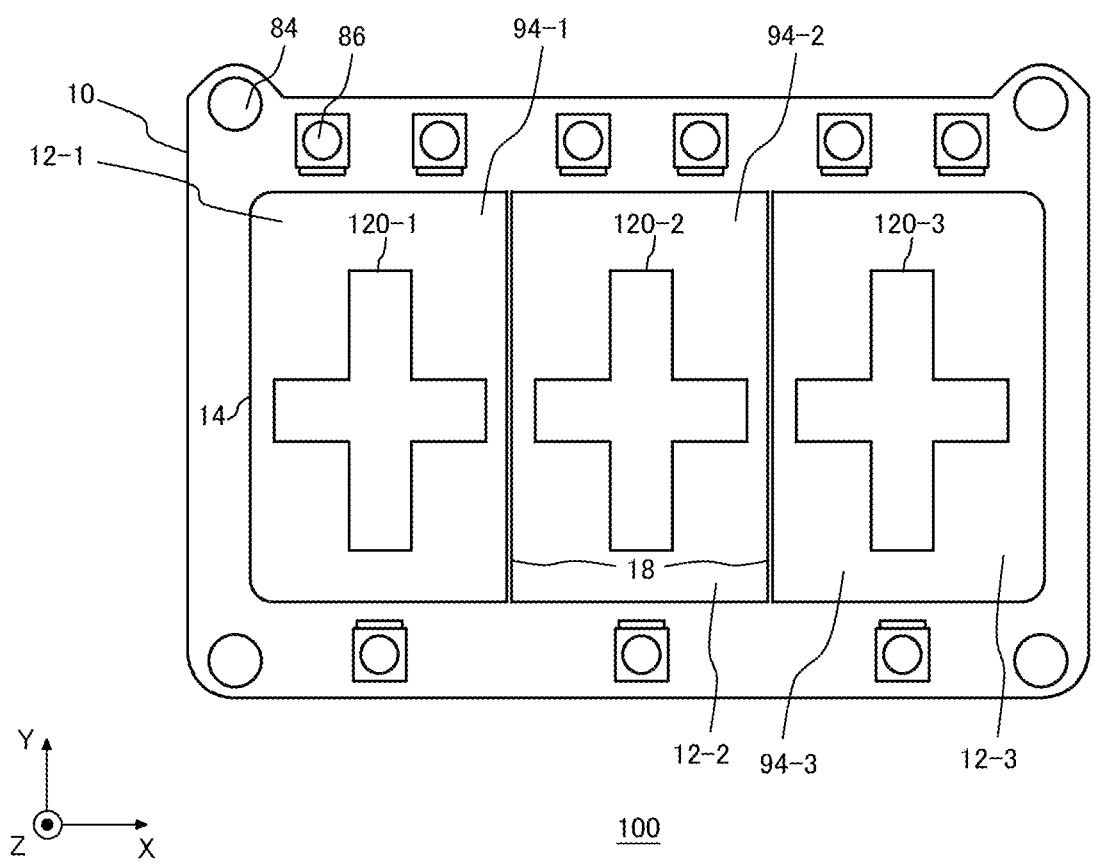
FIG. 5 illustrates another example of the semiconductor module 100.

FIG. 5 illustrates another example of the semiconductor module 100. The semiconductor module 100 in FIG. 5 is different from the semiconductor module 100 in FIG. 1 in the configuration of the reinforcing material 120. Configurations other than that in FIG. 5 may be the same as those in FIG. 1.

The reinforcing material 120 in FIG. 5 may be a cruciform-shape protruding respectively in the X axis direction and the Y axis direction. With such a shape, the fracture of the sealing resin 12 can also be suppressed. In addition, the reinforcing material 120 can be easily processed.

Figure 6:
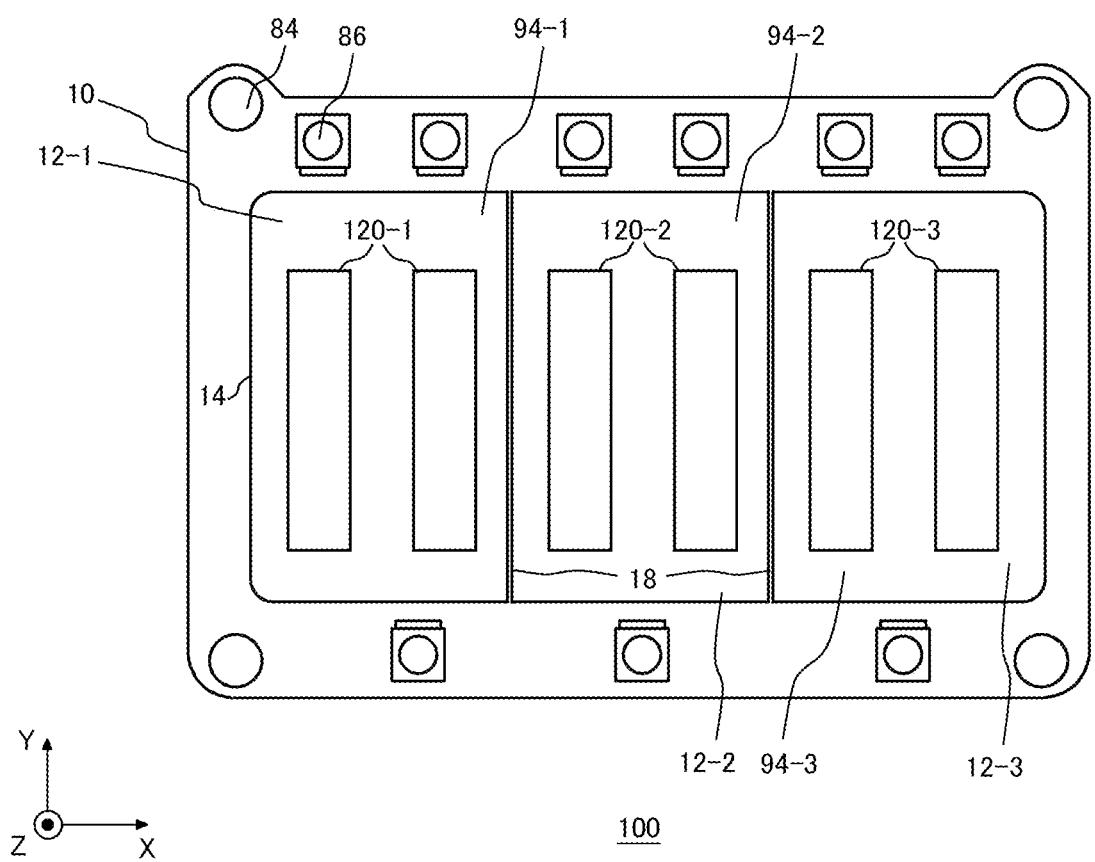
FIG. 6 illustrates another example of the semiconductor module 100.

FIG. 6 illustrates another example of the semiconductor module 100. The semiconductor module 100 in FIG. 6 is different from the semiconductor module 100 in FIG. 1 in the configuration of the reinforcing material 120. Configurations other than that in FIG. 6 may be the same as those in FIG. 1.

The reinforcing material 120 in FIG. 6 has a longitudinal length in the Y axis direction. Two reinforcing materials 120-1 are arrayed in the X axis direction above the sealing resin 12-1. Two reinforcing materials 120-2 are arrayed in the X axis direction above the sealing resin 12-2. Two reinforcing materials 120-3 are arrayed in the X axis direction above the sealing resin 12-3. With such a shape, the fracture of the sealing resin 12 can be suppressed. In addition, the reinforcing material 120 can be easily processed.

Figure 7:
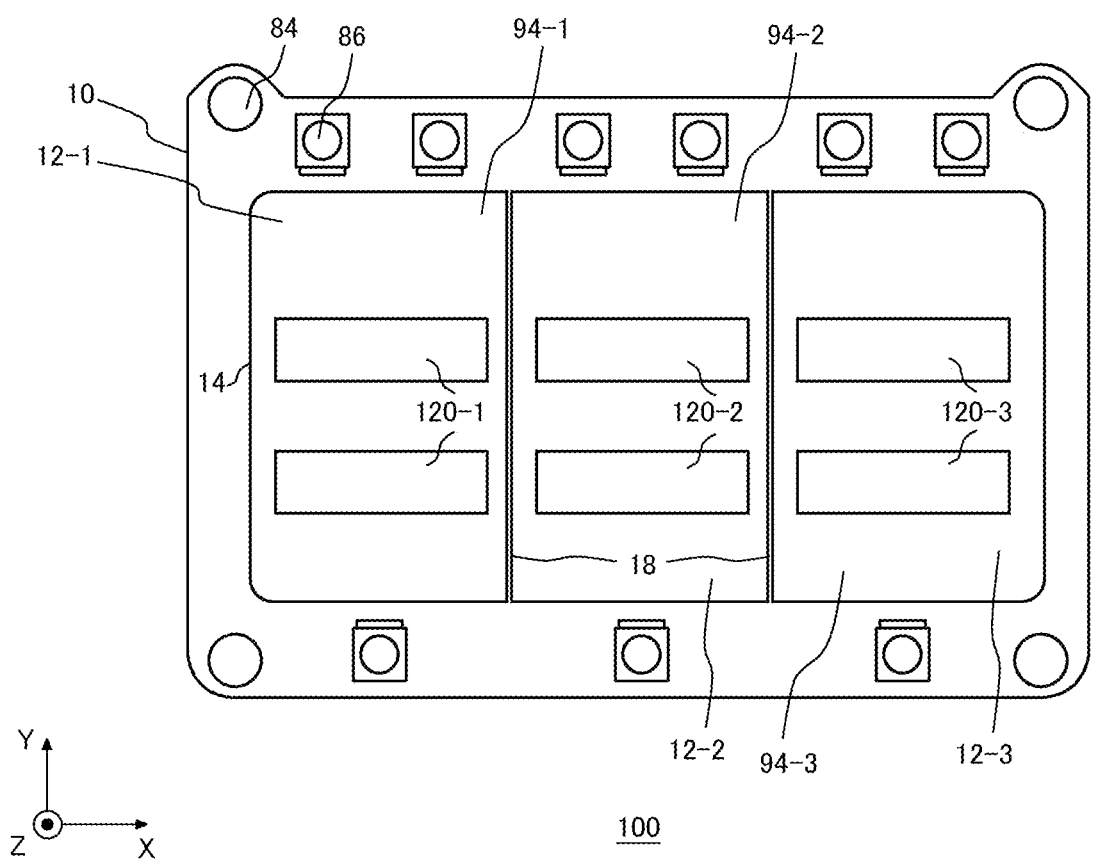
FIG. 7 illustrates another example of the semiconductor module 100.

FIG. 7 illustrates another example of the semiconductor module 100. The semiconductor module 100 in FIG. 7 is different from the semiconductor module 100 in FIG. 1 in the configuration of the reinforcing material 120. Configurations other than that in FIG. 7 may be the same as those in FIG. 1.

The reinforcing material 120 in FIG. 7 has a longitudinal length in the X axis direction. Two reinforcing materials 120-1 are arrayed in the Y axis direction above the sealing resin 12-1. Two reinforcing materials 120-2 are arrayed in the Y axis direction above the sealing resin 12-2. Two reinforcing materials 120-3 are arrayed in the Y axis direction above the sealing resin 12-3. With such a shape, the fracture of the sealing resin 12 can be suppressed. In addition, the reinforcing material 120 can be easily processed.

Figure 8:
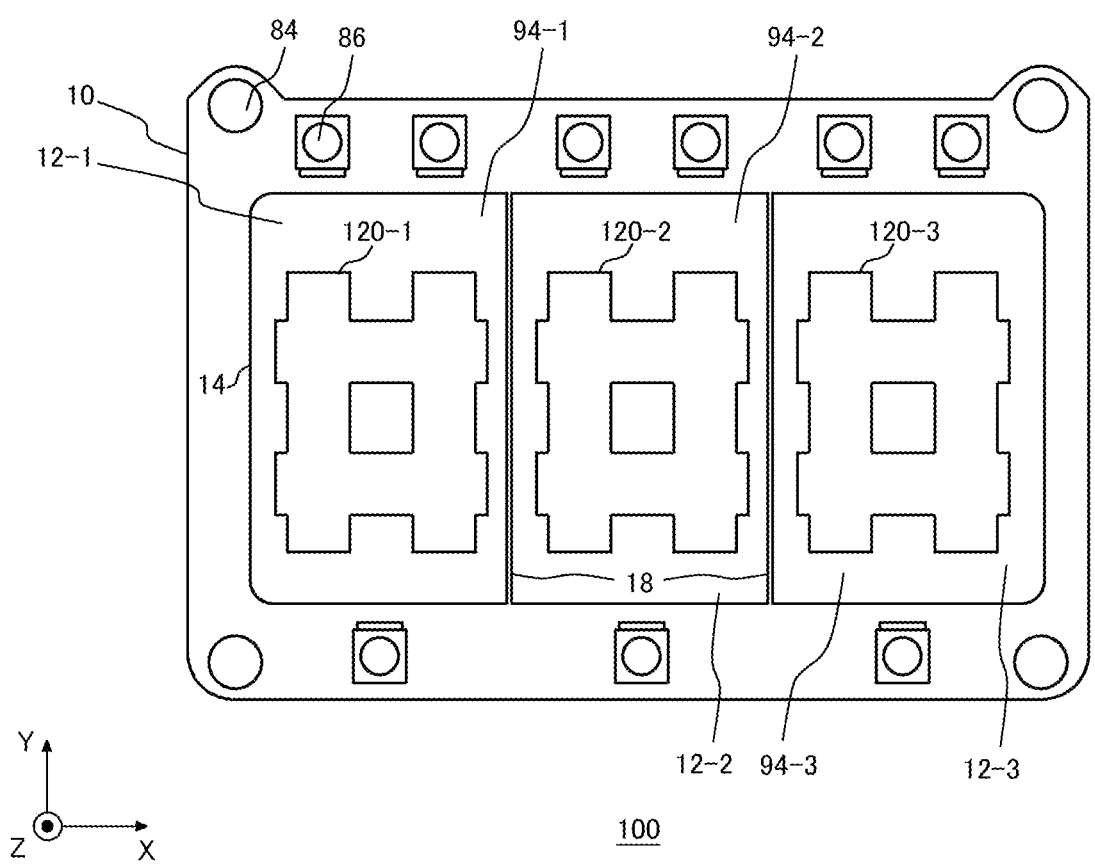
FIG. 8 illustrates another example of the semiconductor module 100.

FIG. 8 illustrates another example of the semiconductor module 100. The semiconductor module 100 in FIG. 8 is different from the semiconductor module 100 in FIG. 1 in the configuration of the reinforcing material 120. Configurations other than that in FIG. 8 may be the same as those in FIG. 1.

The reinforcing material 120 in FIG. 8 is in a shape that combines the reinforcing material 120 in FIG. 6 and the reinforcing material 120 in FIG. 7. With such a shape, the fracture of the sealing resin 12 can be suppressed. In addition, the fracture of the sealing resin 12 can be suppressed over a wider range compared to FIG. 6 and FIG. 7.

In the semiconductor module 100 as shown in FIG. 1, and FIG. 5 to FIG. 8, a reinforcing material 120 is provided on each space 94 divided by the side walls 18 in a top view. This makes it possible to provide reinforcement for each of the sealing resins 12 that are implanted into the spaces 94. In addition, like the semiconductor module 100 as shown in FIG. 6 and FIG. 7, a plurality of reinforcing materials 120 may also be provided on each space 94 divided by the side walls 18 in a top view.

Figure 9:
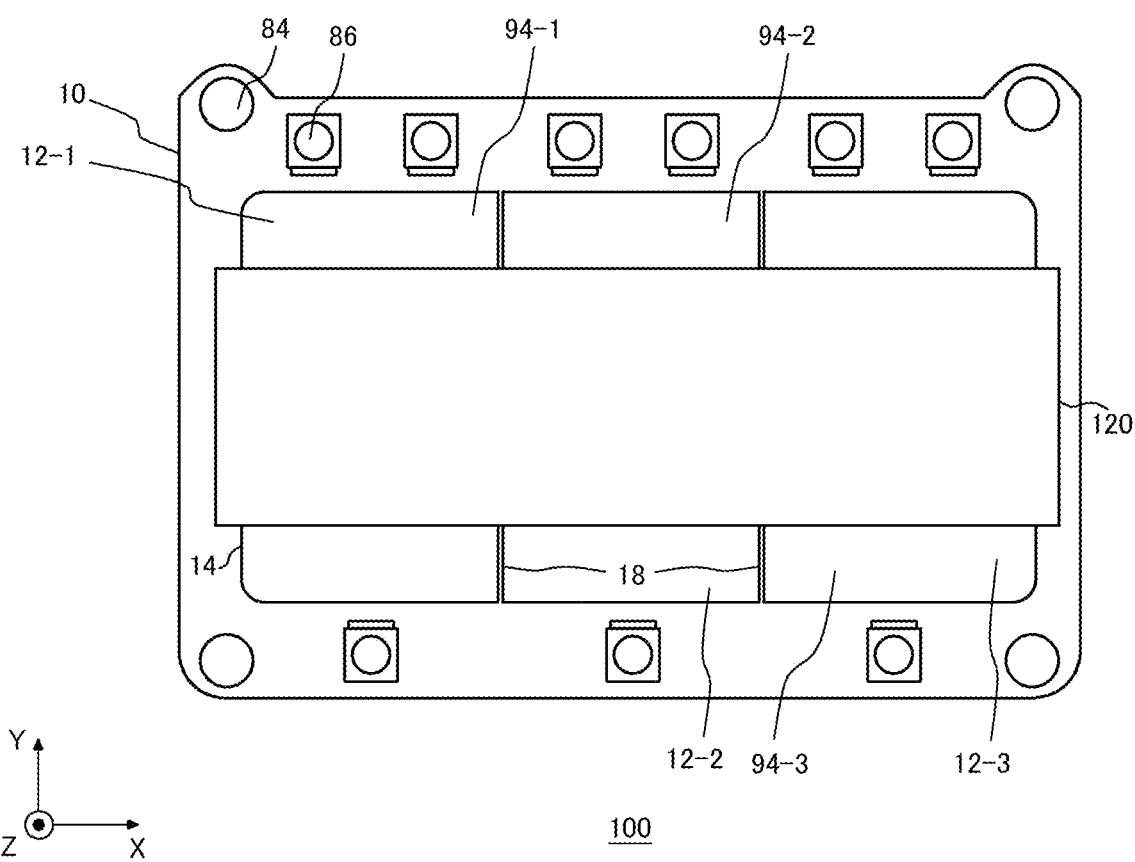
FIG. 9 illustrates another example of the semiconductor module 100.

FIG. 9 illustrates another example of the semiconductor module 100. The semiconductor module 100 in FIG. 9 is different from the semiconductor module 100 in FIG. 1 in the configuration of the reinforcing material 120. Specifically, the reinforcing material 120 is provided across the side walls 18 in a top view. The configurations other than that in the FIG. 9 may be the same as those in FIG. 1.

The reinforcing material 120 in FIG. 9 is provided integrally above the sealing resin 12-1, the sealing resin 12-2 and the sealing resin 12-3. The reinforcing material 120 is provided above the side walls 18. With such a shape, the fracture of the sealing resin 12 can be suppressed. In addition, when compared with the semiconductor module 100 as shown in FIG. 1, and FIG. 5 to FIG. 8, the number of the reinforcing materials 120 can be reduced.

It is noted that the area of the reinforcing material 120 in a top view may be smaller than the area of the sealing resin 12 in a top view. In the example of FIG. 9, the area of the reinforcing material 120 in a top view may be smaller than the sum of the areas of the sealing resin 12-1, the sealing resin 12-2 and the sealing resin 12-3 in a top view. By making the area of the reinforcing material 120 in a top view smaller than the area of the sealing resin 12 in a top view, a place can be provided above the sealing resin 12 where a reinforcing material 120 is not provided. By providing a place, above which no reinforcing material 120 is provided, on a sealing resin 12, gas can be removed from the sealing resin 12.

Figure 10:
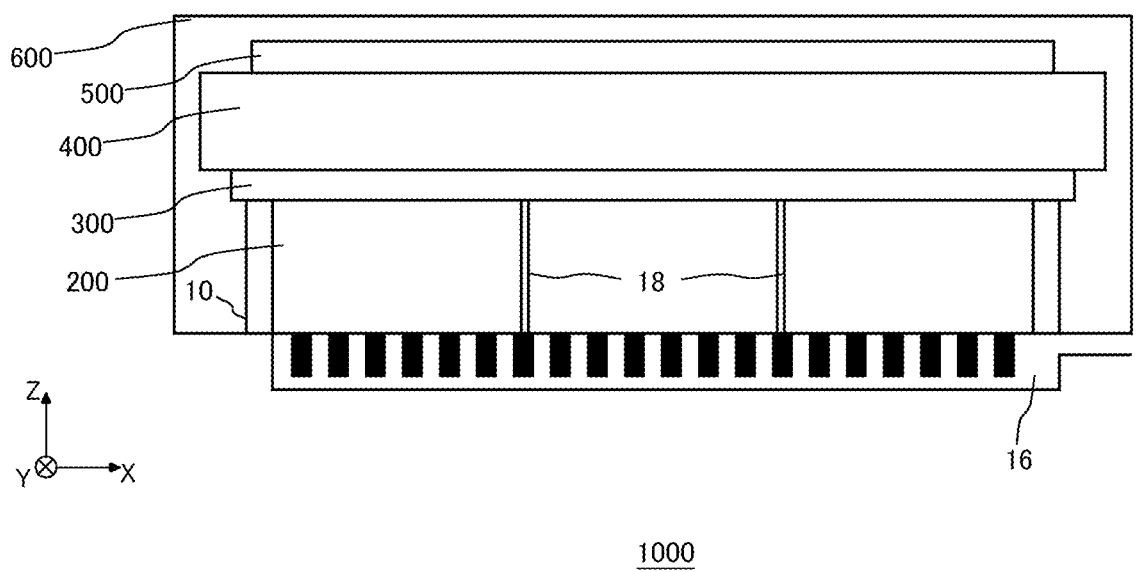
FIG. 10 illustrates one example of an inverter 1000 including a semiconductor module 200.

FIG. 10 illustrates one example of an inverter 1000 including a semiconductor module 200. The inverter 1000 includes a semiconductor module 200, a gate driver substrate 300, a capacitor module 400, a control board 500 and a casing portion 600. The inverter 1000 is a power conversion device for converting power.

The semiconductor module 200 in FIG. 10 is different from the semiconductor module 100 in FIG. 1 in that a plate-shaped gate driver substrate 300 is provided as a plate-shaped reinforcing material. The configurations other than that of the semiconductor module 200 in FIG. 10 may be the same as those of the semiconductor module 100 in FIG. 1.

The gate driver substrate 300 is provided above the semiconductor module 200. One or more gate drivers are mounted on the gate driver substrate 300. The gate driver controls the semiconductor chip 40 of the semiconductor module 200. The gate driver may control the gate voltage applied to a gate electrode of the semiconductor chip 40 of the semiconductor module 200. The gate driver is a wiring substrate on which the wiring is patterned.

A capacitor module 400 and a control board 500 are provided above the semiconductor module 200. The capacitor module 400 smoothes the voltage applied to the semiconductor module 200. The control board 500 controls the gate driver mounted on the gate driver substrate 300. The casing portion 600 houses the semiconductor module 200, the gate driver substrate 300, the capacitor module 400 and the control board 500.

Figure 11:
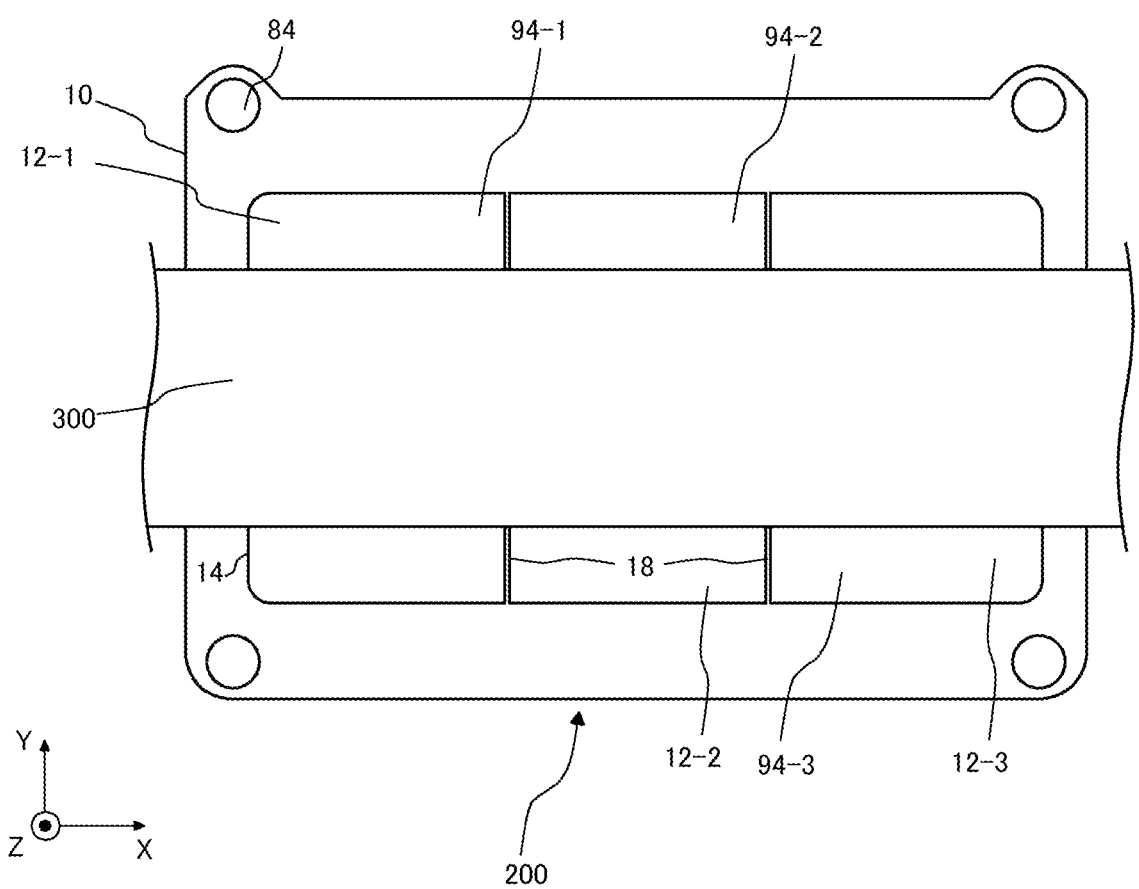
FIG. 11 illustrates an arrangement example of the semiconductor module 200 and a gate driver substrate 300 in a top view.

FIG. 11 illustrates an arrangement example of the semiconductor module 200 and the gate driver substrate 300 in a top view.

In FIG. 11, the sealing resin 12 of the semiconductor module 200 overlaps with the gate driver substrate 300 in a top view. Next, the sealing resin 12 of the semiconductor module 200 is arranged in close contact, that is, directly bonded, with the gate driver substrate 300. In this way, by making the gate driver substrate 300 a material with a higher Young's modulus than the sealing resin 12, the gate driver substrate 300 can function as a reinforcing material. That is, the reinforcing material may be a wiring substrate on which the wiring is patterned. The reinforcing material may be the gate driver substrate 300. Accordingly, even if no reinforcing material other than the gate driver substrate 300 is provided, the fracture in the sealing resin 12 can be suppressed. In this case, it is preferable to provide a place above the sealing resin 12 where no gate driver substrate 300 is provided.

Figure 12:
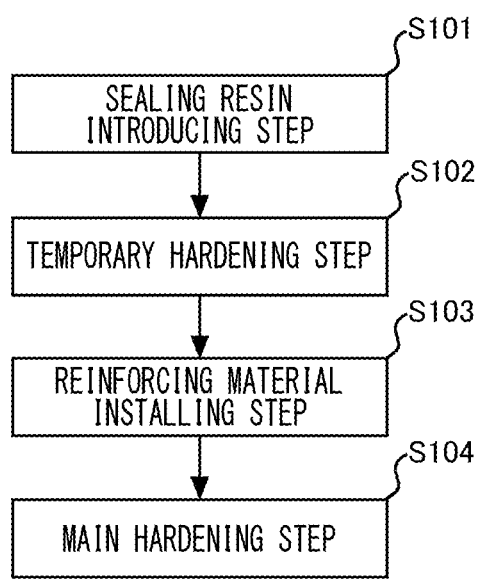
FIG. 12 illustrates one example of a method of installing a reinforcing material 120.

FIG. 12 illustrates one example of a method of installing the reinforcing material 120. The method of installing includes a sealing resin introducing step S101, a temporary hardening step S102, a reinforcing material installing step S103, and a main hardening step S104.

At the sealing resin introducing step S101, the sealing resin 12 is introduced into the resin case 10. At the sealing resin introducing step S101, the sealing resin 12 is introduced to fulfill the space 94.

At the temporary hardening step S102, the sealing resin 12 is temporarily hardened. At the temporary hardening step S102, the sealing resin 12 is not completely hardened. The temperature at the temporary hardening step S102 is, as one example, 60° C. At the temporary hardening step S102, gas is generated from the sealing resin 12.

At the reinforcing material installing step S103, the reinforcing material 120 is installed. After the temporary hardening step S102, the reinforcing material 120 can be fixed to the sealing resin 12 in order to install the reinforcing material 120.

At the main hardening step S104, the sealing resin 12 is mainly hardened. Main hardening is hardening the sealing resin 12 at a temperature higher than that during the temporary hardening. The temperature at the main hardening step S104 is, as one example, 185° C. At the main hardening step S104, gas is generated from the sealing resin 12. By performing the main hardening step S104, the reinforcing material 120 can be complete fixed to the sealing resin 12.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module, comprising:
   a semiconductor chip;
   a circuit board on which the semiconductor chip is mounted;
   a sealing resin including epoxy resin for sealing the semiconductor chip and the circuit board; and
   a reinforcing material, with a higher Young's modulus than the sealing resin, provided in close contact with the sealing resin above at least a part of the sealing resin,
   wherein an area of the reinforcing material in a top view is smaller than an area of the sealing resin in a top view.

2. The semiconductor module according to claim 1, further comprising:
   a resin case for enclosing a space for housing the semiconductor chip, wherein
   the sealing resin is provided inside the resin case.

3. The semiconductor module according to claim 2, wherein
   the resin case has a side wall for dividing the space.

4. The semiconductor module according to claim 3, wherein
   the reinforcing material is provided for each divided space in a top view.

5. The semiconductor module according to claim 3, wherein
   the reinforcing material is provided across the side wall in a top view.

6. The semiconductor module according to claim 3, wherein
   a shortest distance from the reinforcing material to an interface between the resin case and the sealing resin in a top view is shorter than either a lateral width or a longitudinal width of an edge of the resin case.

7. The semiconductor module according to claim 3, further comprising
   a cooling portion connected directly or indirectly to a lower surface of the resin case.

8. The semiconductor module according to claim 2, wherein
   a shortest distance from the reinforcing material to an interface between the resin case and the sealing resin in a top view is shorter than either a lateral width or a longitudinal width of an edge of the resin case.

9. The semiconductor module according to claim 2, further comprising
   a cooling portion connected directly or indirectly to a lower surface of the resin case.

10. The semiconductor module according to claim 2, wherein
    the reinforcing material is provided on an upper surface of the sealing resin.

11. The semiconductor module according to claim 2, wherein
    the reinforcing material is embedded in the sealing resin.

12. The semiconductor module according to claim 2, wherein
    the reinforcing material is a plate-shaped member.

13. The semiconductor module according to claim 1, wherein
    the reinforcing material is provided on an upper surface of the sealing resin.

14. The semiconductor module according to claim 1, wherein
    the reinforcing material is embedded in the sealing resin.

15. The semiconductor module according to claim 1, wherein
    the reinforcing material is a plate-shaped member.

16. The semiconductor module according to claim 1, wherein
    the reinforcing material includes glass.

17. The semiconductor module according to claim 1, wherein
    the reinforcing material is provided above at least a part of the semiconductor chip in a top view.

18. The semiconductor module according to claim 1, wherein
    the sealing resin includes silica filler.

* * * * *